United States Patent [19]
Ottone et al.

[11] Patent Number: 5,354,153
[45] Date of Patent: Oct. 11, 1994

[54] MACHINE TOOL PART LOADING AND UNLOADING METHOD AND DEVICE PARTICULARLY FOR MACHINING PRINTED CIRCUIT BOARDS

[75] Inventors: Renato Ottone, Ivrea; Luigi Piovano, S. Giusto Canavese; Guido Gaida, Ponderano, all of Italy

[73] Assignee: Pluritec Italia S.p.A., Borgomanero, Italy

[21] Appl. No.: 972,975

[22] Filed: Nov. 6, 1992

[30] Foreign Application Priority Data

Nov. 8, 1991 [IT] Italy ............... TO91 A 000858

[51] Int. Cl.⁵ .................. B23B 35/00; B23B 47/18
[52] U.S. Cl. ............... 408/1 R; 198/468.2; 408/69; 414/19; 414/20; 414/222; 414/331; 414/401
[58] Field of Search ............ 408/1 R, 69, 70; 198/468.2; 414/17, 19, 20, 222, 331, 401; 901/6

[56] References Cited

U.S. PATENT DOCUMENTS

| | | | |
|---|---|---|---|
| 4,480,364 | 11/1984 | Kosmowski | 408/69 |
| 4,691,817 | 9/1987 | Haar | 198/468.2 |
| 4,824,310 | 4/1989 | Kosmowski | 414/222 |
| 4,867,297 | 9/1989 | Saitoh | 198/346.2 |
| 5,062,190 | 11/1991 | Kitamura | 29/33 P |

FOREIGN PATENT DOCUMENTS

| | | | |
|---|---|---|---|
| 0117141 | 8/1984 | European Pat. Off. | |
| 1332673 | 6/1963 | France | 408/69 |
| 215058 | 10/1984 | German Democratic Rep. | 414/331 |
| 295929 | 12/1986 | Japan | 414/331 |

*Primary Examiner*—Daniel W. Howell
*Attorney, Agent, or Firm*—Ladas & Parry

[57] ABSTRACT

On a drilling machine for drilling packs of printed circuit boards, the packs are loaded and unloaded between a support and the work table by engaging a pin on the pack via a pair of jaws and by moving the table longitudinally. The pack is retained by a bar for enabling two bars to engage and locate a further pin on the pack; further retaining elements provide for sliding the pack in relation to the table; and a member is activated for aligning the pack against a fixed locator. The support forms part of a rack operated vertically in steps by a lifter located behind the drilling machine.

21 Claims, 9 Drawing Sheets

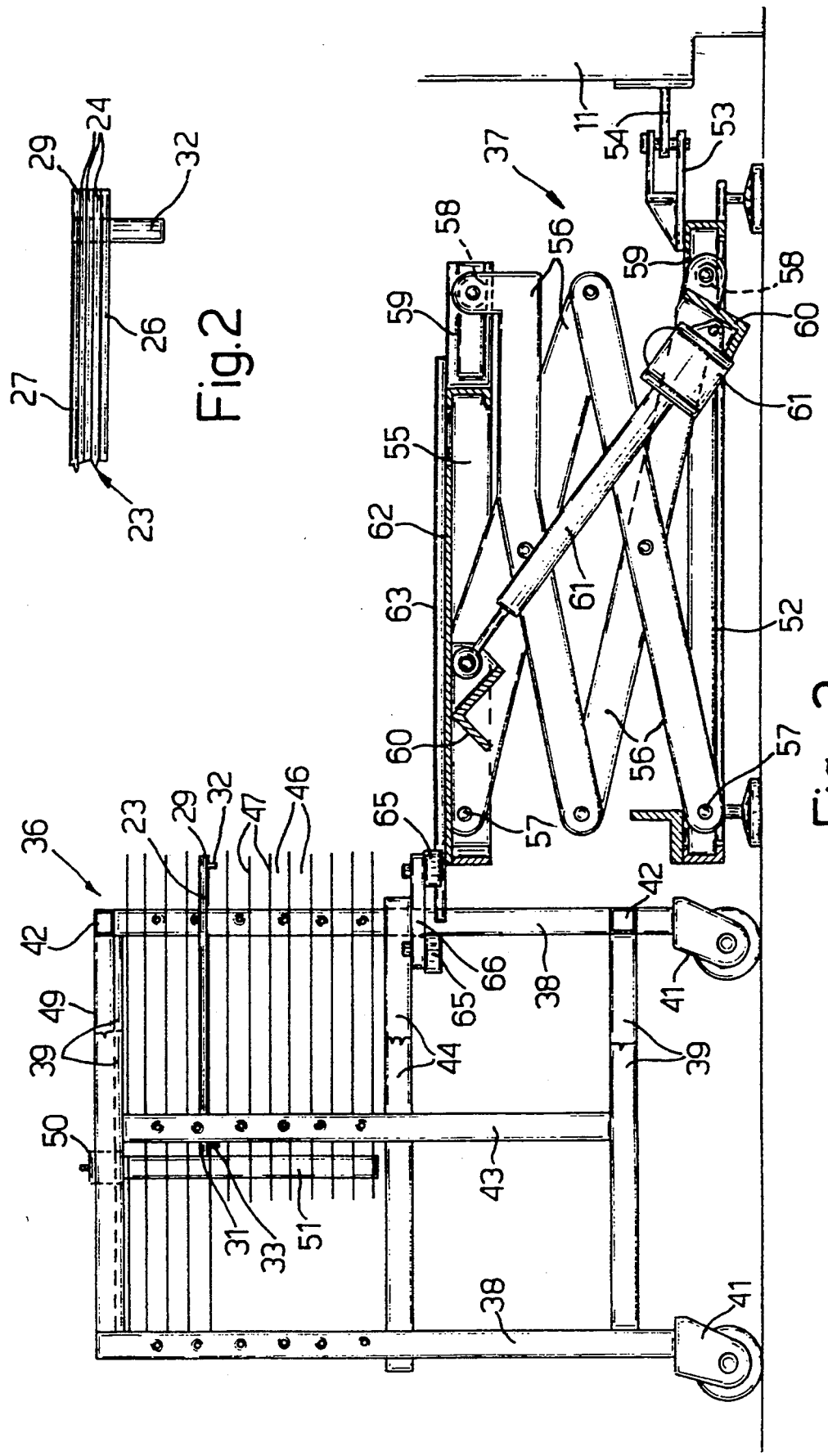

MACHINE TOOL PART LOADING AND UNLOADING METHOD AND DEVICE PARTICULARLY FOR MACHINING PRINTED CIRCUIT BOARDS

BACKGROUND OF THE INVENTION

The present invention relates to a method and relative device for loading and unloading parts on a machine tool, particularly for machining printed circuit boards.

Machine tools and machining centers are frequently equipped with automatic part loading and unloading devices. Such devices, however, are unsuitable for loading and unloading printed circuit boards, which require extremely careful handling, and, indeed, prior to machining, are normally packed in groups of a given number of boards held together and protected by two auxiliary plates.

One known device for loading and unloading packs of printed circuit boards provides for transferring the pack between a pack store and the work table of a drilling machine, and comprises a pack handling system the operating axes of which are necessarily controlled by a numerical control unit. In addition to the complex design and high cost of the above known device, it is also extremely cumbersome, by virtue of the space required both to the side of the drilling machine and for changing the pack store.

SUMMARY OF THE INVENTION

It is an object of the present invention to provide a highly straightforward, reliable part loading and unloading device designed to overcome the aforementioned drawbacks typically associated with known devices.

According to the present invention, there is provided a machine tool part loading and unloading device wherein a work table travels along at least one axis, and which comprises means for supporting the part, and means for transferring the part between said supporting means and a work position on the table; characterized by the fact that said transfer means comprise a device on said table for engaging the part; and said transfer being effected by moving said table along said axis.

According to the present invention, there is also provided a method of loading and unloading parts between a support and the work table of a machine tool, characterized by the fact that, for loading the part, it comprises a stage wherein a first element on said part is engaged by said table; a stage wherein said part is extracted from said support by moving said table; a stage wherein the extracted part is moved in relation to the table into an intermediate position; and a stage wherein said table is returned for re-engaging said element.

BRIEF DESCRIPTION OF THE DRAWINGS

A preferred non-limiting embodiment of the device according to the present invention will be described by way of example with reference to the accompanying drawings, in which:

FIG. 2 shows a partial larger-scale view of a pack of printed circuit boards for drilling;

FIG. 3 shows a partially sectioned side view of part of the FIG. 1 device in a different operating position;

DETAILED DESCRIPTION OF THE INVENTION

FOREWORD

Figure 1:
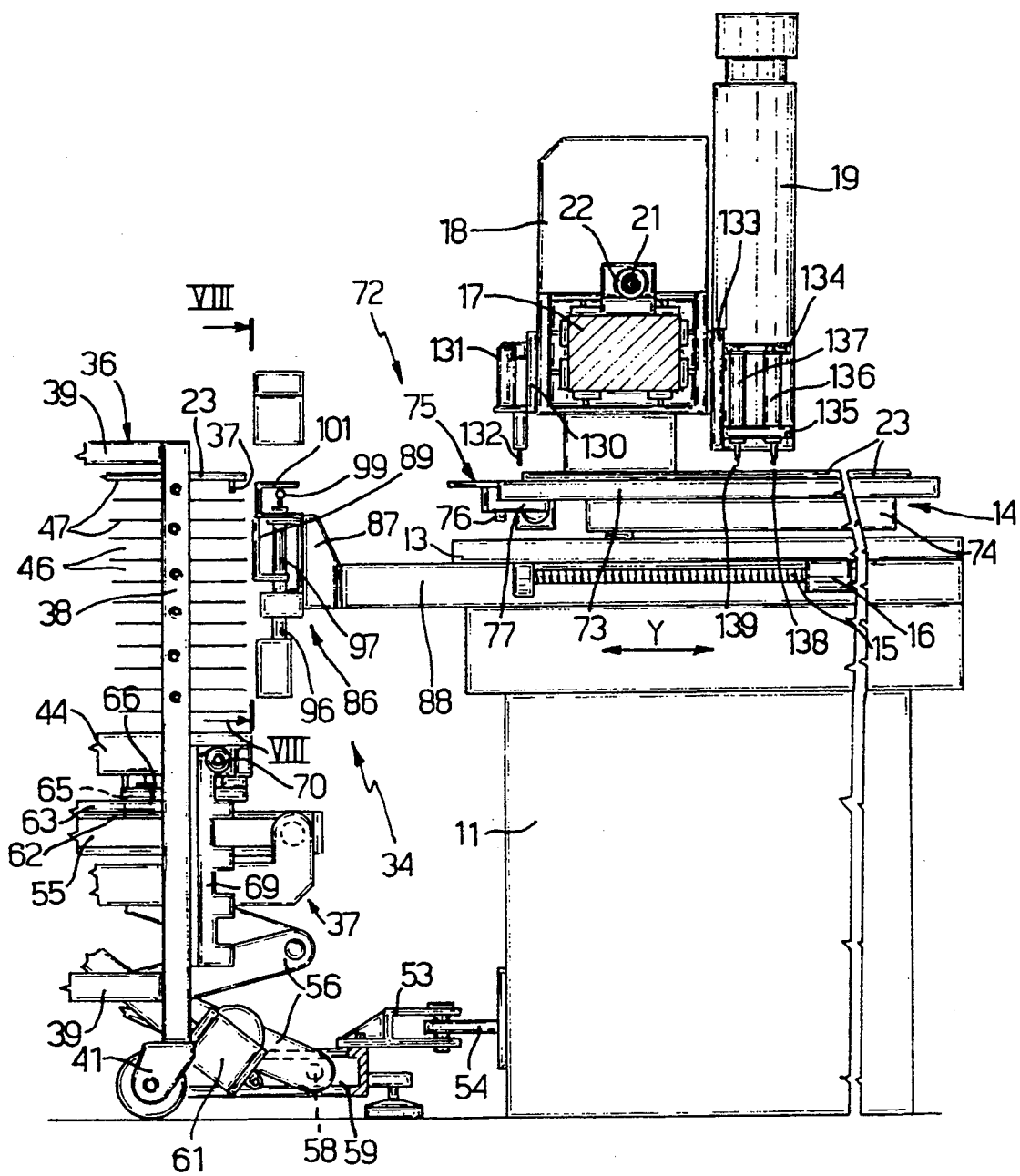
FIG. 1 shows a partial side view of a printed circuit board drilling machine incorporating a loading and unloading device in accordance with the present invention.

Number 11 in FIG. 1 indicates the bed of a printed circuit board drilling machine, which bed comprises a longitudinal slideway 13 of granite along which travels a work table 14. A screw 15 on slideway 13 engages a nut screw 16 integral with table 14, and is rotated by a numerical control servomotor (not shown) for moving table 14 along axis Y.

The drilling machine also comprises a fixed crosspiece 17 also made of granite and along which travels transversely a carriage 18 supporting a drilling head 19 and which is moved along axis X in numerically controlled manner by means of a second screw-nut screw pair 21, 22. The side of the machine parallel to axis X and adjacent to drilling head 19 presents the operator controls and is hereinafter referred to as the front side, the opposite side hereinafter being referred to as the rear side.

Drilling head 19 operates in known manner on a pack 23 of a number of printed circuit boards 24, e.g. three in FIG. 2, to be drilled simultaneously, and which are packed between an auxiliary bottom plate 26 and an auxiliary cover plate 27. As shown by the dotted line in FIG. 4, pack 23 is positioned on table 14 with the two longitudinal edges 28 parallel to axis Y, and the respective front and rear edges 29 and 31 perpendicular to axis Y.

Bottom plate 26 presents a pair of pins 32, 33 (FIG. 3) projecting perpendicularly beneath plate 26 and which act as locating pins for packing boards 24. Pins 32 and 33 are located at the mid point of respective sides 29 and 31, and are hereinafter referred to as front pin 32 and rear pin 33.

PACK STORE

The loading and unloading device, indicated as a whole by 34, comprises a removable store and a selecting or lifting device 37 by which the store is engaged. The store substantially consists of a rack 36 comprising four pillars 38 (FIG. 3) mounted on respective castors 41 and connected in pairs by two side members 39. The pairs of pillars 38 are also connected by cross members 42, and the side members 39 on each side present an intermediate vertical bar 43.

Rack 36 is divided vertically into two parts by an intermediate frame 44 (FIG. 4) connected to pillars 38 and bars 43. The portion of rack 36 above frame 44 presents a number of superimposed cells 46 for housing respective packs 23 of boards for drilling. More specifically, each cell 46 is defined by a supporting surface consisting of two plates 47 arranged side by side so as to define on the supporting surface a central longitudinal passage 48 for housing and enabling the passage of pins 32 and 33 of pack 23.

Each plate 47 is fitted in known manner to bar 43, and rests on a pair of brackets (not shown) fitted to the two pillars 38 on the corresponding side of rack 36. The brackets on each pillar 38 may consist of a single plate with arms corresponding with the location of plates 47.

Between the two top cross members 42, there are fitted two longitudinal prismatic bars 49 on which travels a slide 50 fitted with a vertical bar or blade 51 for rearwardly arresting packs 23 and which is housed inside passages 48 between pairs of plates 47. Slide 50 is positioned longitudinally on bars 49 according to the length of pack 23 for drilling, and is secured by setscrews.

Lifter 37 comprises a fixed horizontal frame 52 floor mounted on height-adjustable feet; and two front connecting plates 53 fitted in removable manner, by means of a spherical articulated joint, to two brackets 54 on bed 11 of the drilling machine. Lifter 37 also comprises a movable horizontal frame 55, the longitudinal sides of which are connected to the corresponding sides of fixed frame 52 by a pair of pantographs 56.

More specifically, each pantograph 56 pivots on two pins 57 fitted respectively to the rear of frames 52 and 55, and presents two rollers 58 rolling inside two horizontal C-shaped guides 59 on the front of frames 52 and 55. The two pantographs 56 provide for moving frame 55 parallel to itself and in relation to fixed frame 52, and each of frames 52 and 55 is fitted with a respective cross member 60 on which pivots one end of a linear lift actuator 61, e.g. of the type comprising a reversible electric geared motor for driving a screw-nut screw pair.

Movable frame 55 is fitted on top with a surface 62 in turn fitted with a prismatic guide 63 extending longitudinally along the center line of surface 62 and terminating at the rear with a wedge-shaped portion 64 projecting from frame 55. Guide 63 is engaged by two pairs of vertical-axis rollers 65 on two longitudinal brackets 66 fitted beneath the front side of intermediate frame 44 of rack 36.

Frame 44 also presents four locating elements 67 engaged by four counterelements 68 on frame 52. One of front pillars 38 of rack 36 is fitted with a toothed bar 69 (FIG. 1), the teeth of which present the same spacing as the vertical spacing between pairs of plates 47, and are detected by a proximity sensor 70 fitted to a column 71 (FIG. 4) in turn fitted to frame 52 of lifter 37. Sensor 70 provides for supplying read signals to the electronic control unit of actuator 61 (FIG. 3).

Figure 4:
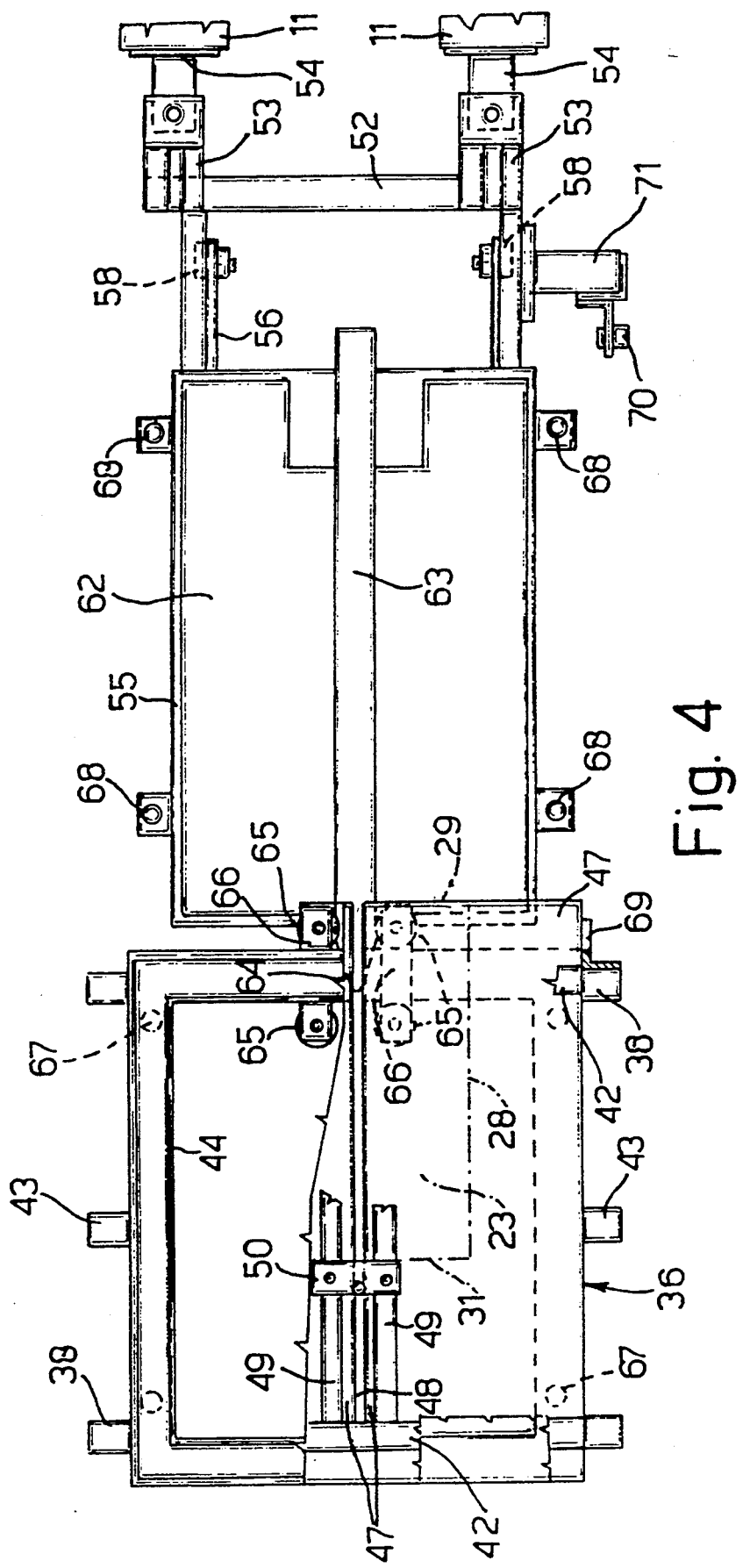
FIG. 4 shows a partially sectioned plan view of the FIG. 3 device.

When detached from lifter 37, as shown in FIGS. 3 and 4, rack 36 may be transferred to a loading station where the machined packs 23 are removed and the rack loaded with further packs 23 for drilling. The loaded rack 36 is then positioned behind lifter 37 (to the left in FIGS. 3 and 4); and actuator 61 is operated so as to lower surface 62 so that guide 63 is on a level with rollers 65.

Rack 36 is then pushed manually on to lifter 37, by engaging wedge 64 and guide 63 between rollers 65, and into the longitudinal position shown in FIG. 1; and actuator 61 is operated so as to raise movable frame 55, engage counterelements 68 (FIG. 4) and locating elements 67, and so raise rack 36.

The upward movement of rack 36 is arrested by toothed bar 69 and proximity sensor 70 when plates 47 of the topmost cell 46 on rack 36 are set to the FIG. 1 position wherein pack 23 is loaded on and off work table 14 of the machine. Subsequently, actuator 61 is moved vertically in steps to bring the pairs of plates 47 of each successive cell 46 on rack 36 into the loading and unloading position, after which, rack 36 is lowered by operating actuator 61 of lifter 37 in reverse.

PACK HANDLING DEVICE

According to the present invention, loading and unloading device 34 comprises a pack handling device substantially incorporated in a fixture 72 (FIG. 1) on work table 14 of the machine. Fixture 72 provides for loading, positioning and unloading packs 23, and comprises a supporting plate 73 fitted to frame 74 of table 14 and having a device at the rear for engaging pins 32 and 33 of pack 23. Said device comprises a pair of jaws 75 (FIG. 5) pivoting on two vertical pins 76 projecting beneath plate 73.

More specifically, each jaw comprises a front L-shaped arm 77 (FIG. 6) connected by a connecting rod 78 to a respective rod 79 of a common pneumatic actuator 80 fitted to two tabs of a plate 81 fitted inside a bottom recess 82 (FIG. 7) on plate 73. Each jaw 75 also comprises a Z-shaped bend 83 with a rectangular recess 84 for engaging pin 32, and a guide blade 85. Alternatively, plate 81 and connecting rods 78 may be eliminated by pivoting the ends of a single rod 79 and actuator 80 directly on the two arms 77.

The pack handling device also comprises a device 86 for temporarily clamping pack 23, and which is fitted to a shaped transverse plate 87 (FIG. 7) in turn fitted to a rear appendix 88 on fixed slideway 13. Device 86 comprises a retaining member consisting of a central prismatic bar 89 movable vertically and which, when raised, is located between the two bends 83 (FIG. 6) of jaws 75.

Figure 8:
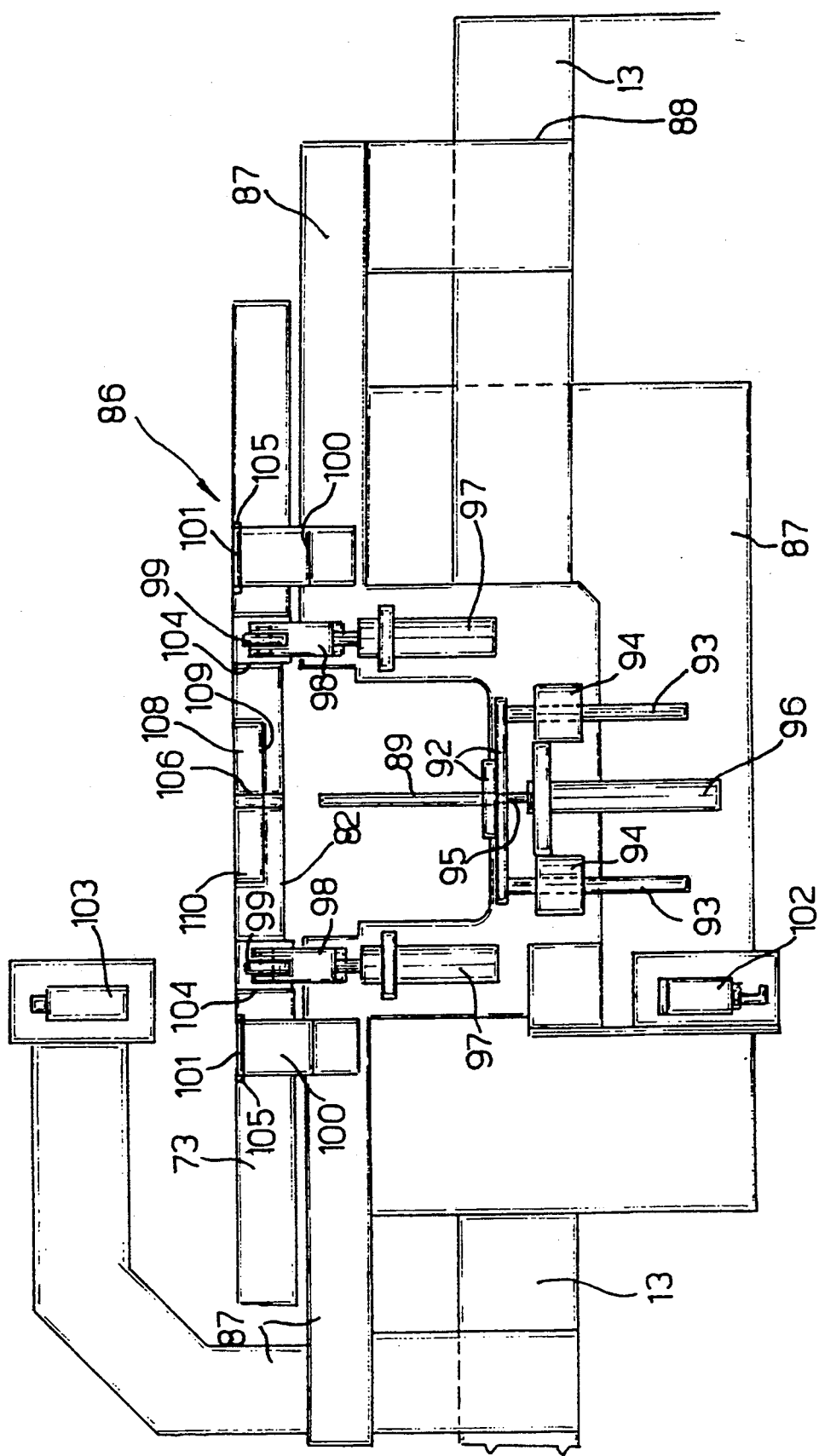
FIG. 8 shows a section along line VIII—VIII in FIG. 1.

The top portion of bar 89 presents two opposed vertical V-shaped grooves 90 and 91 for respectively locking rear pin 33 and front pin 32. Bar 89 is integral with a crosspiece 92 (FIG. 8) fitted with two pins 93 guided inside two fixed sleeves 94, and which in turn is fitted to a rod 95 operated vertically by a pneumatic actuator 96 on plate 87.

On either side of bar 89, plate 87 is fitted with a further two pneumatic actuators 97 for vertically operating respective rods 98, the top end of each of which presents a lifting member consisting of a roller 99 (FIG. 7) designed to engage bottom plate 26 (FIG. 2) of pack 23. Plate 87 also presents two plates 100, each having an upper tab 101 cooperating with bottom plate 26 of pack 23; a photodiode 102; and a respective photoelectric sensor 103 for detecting the passage of rear edge 31 of pack 23.

Figure 5:
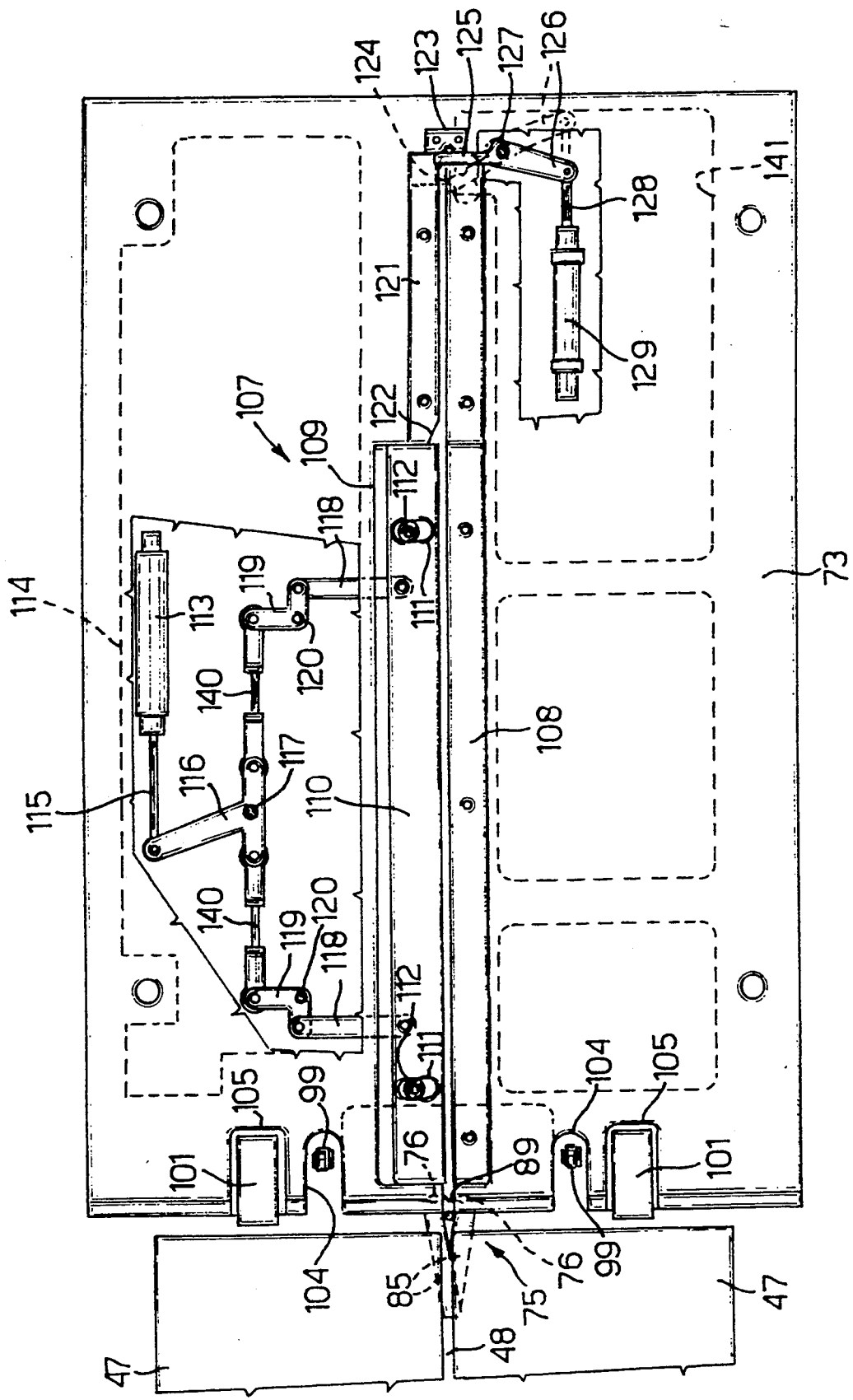
FIG. 5 shows a partially sectioned plan view of a fixture on the work table of the drilling machine.

Plate 73 of fixture 72 presents a pair of openings 104 (FIG. 4), next to recess 82, for enabling the passage of respective rollers 99 when plate 73 is backed up as shown in FIG. 5; two upper recesses 105 for housing respective tabs 101 of plates 100 in the FIG. 5 position; and an opening 106 (FIG. 6) for enabling the passage of bar 89.

Plate 73 also presents a device 107 (FIG. 5) for accurately positioning pack 23, and which comprises a bar 108 for longitudinally guiding pins 32, 33, and fitted inside a long depression 109 formed on the top of plate 73. Next to the rear portion of bar 108, there is provided a locating bar 110 having a certain amount of transverse movement and two slots 111 engaging respective rollers 112 on plate 73.

Device 107 also comprises a pneumatic actuator 113 housed in a depression 114 on the bottom of plate 73, and which, via rod 115, provides for operating one arm of a T-shaped lever 116 pivoting on pin 117 of plate 73. Bar 110 is operated by lever 116 via two connecting rods 118, two symmetrical cranks 119 pivoting on two pins 120 of plate 73, and two ties 140.

Next to the front portion of bar 108, top depression 109 is fitted inside with a further fixed bar 121 defining, with the front portion of bar 108, a fixed straight guide for pin 32. The rear end of bar 121 presents an inclined lead-in edge 122 for pin 32; and the front end of depression 109 presents a locator 123 having a V-shaped seat and defining a limit stop for pin 32.

At stop 123, a bottom opening 124 in bars 121 and 122 houses arm 125 of a lever 126 in turn housed inside a further bottom depression 141 in plate 73 and pivoting on pin 127 of plate 73. Lever 126 is connected to rod 128 of a further pneumatic actuator 129; and arm 125 acts on pin 32 of pack 23, so as to push it positively on to locator 123.

Carriage 18 on machining head 19 (FIG. 1) presents a number of retaining elements for front and rear edges 29 and 31 (FIG. 4) of pack 23. More specifically, carriage 18 (FIG. 1) presents a rear support 130 fitted with a first pneumatic actuator 131 located in the longitudinal plane of the axis of head 19, and which provides for vertically operating a blade 132 engaging rear edge 31 of pack 23.

At the front, carriage 18 also presents a further support 133 located to the side of head 19 and having two brackets 134 and 135. Bracket 134 is fitted with a further two pneumatic actuators 136 and 137 for vertically operating respective blades 138 and 139 guided inside bracket 135, located a given longitudinal distance apart, and which provide for individually engaging front edge 29 of pack 23.

PACK LOADING

Figure 6:
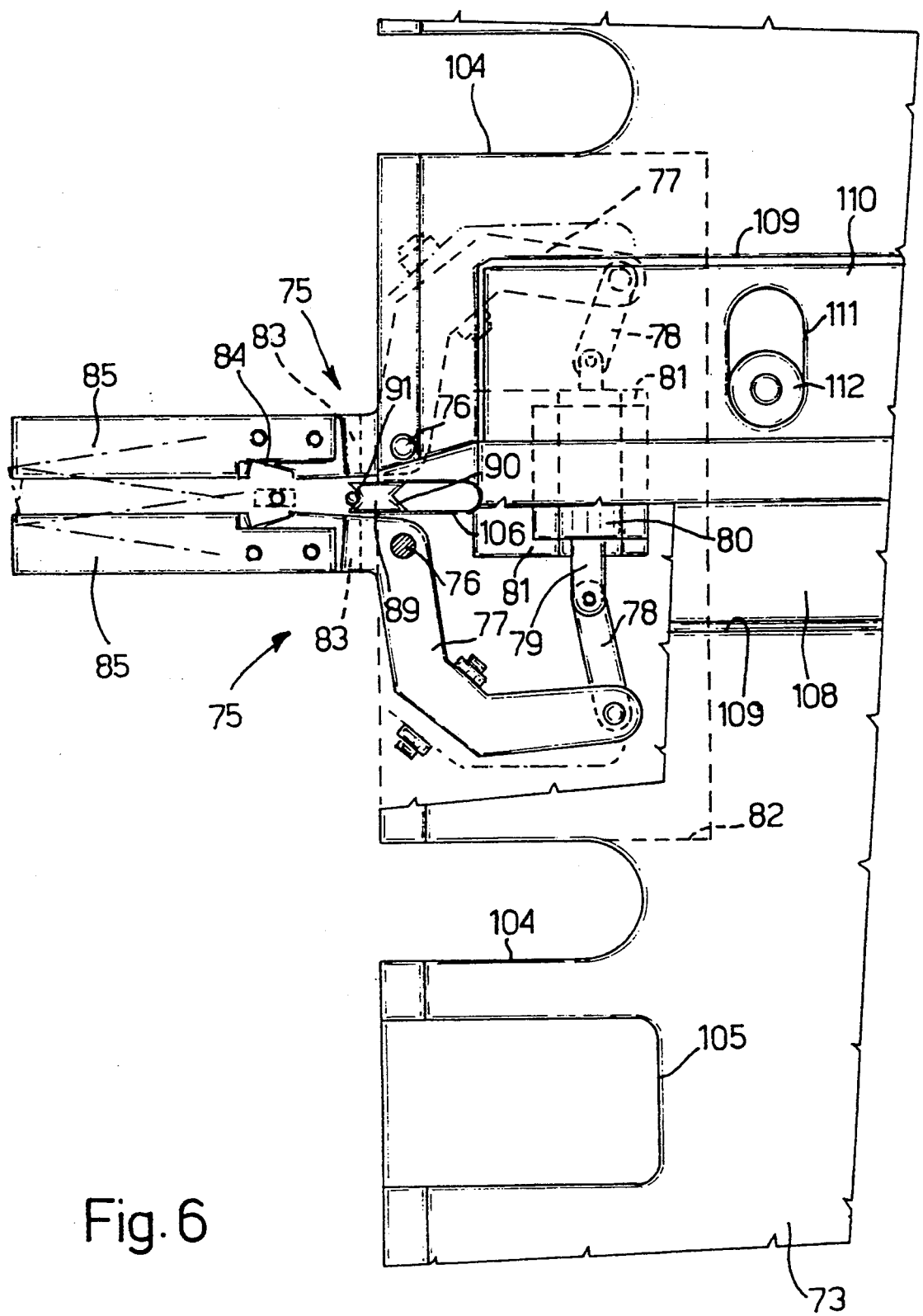
FIG. 6 shows a partial larger-scale plan view of a detail in FIG. 5.

Assuming lifter 37 has raised rack 36 so that the supporting surface of pack 23 formed by plates 47 (the topmost surface in FIGS. 1 and 7) is positioned on a level with plate 73 of table 14; in this case, table 14 is located a given distance from rack 36; jaws 75 are open as shown in FIG. 6; movable bar 110 is maintained a given distance from fixed bar 108, so that lever 116 (FIG. 5) and cranks 119 are rotated clockwise in relation to the FIG. 5 position; and actuator 129 maintains lever 126 in the position shown by the dotted line in FIG. 5.

Figure 9A:
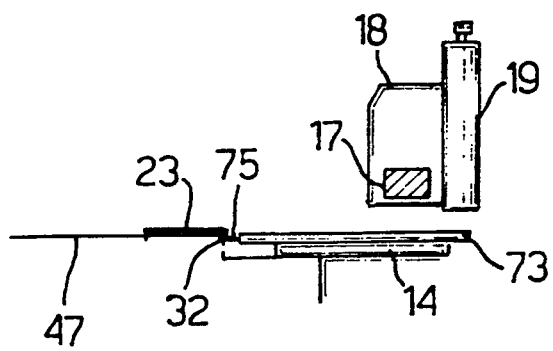
FIGS. 9A, 9B, 9C, 9D, and 9E show the operating sequence for loading a pack of printed circuit boards on to the table.

To begin with, table 14 is backed up so that recesses 84 of jaws 75 (FIG. 6) correspond with front pin 32 of pack 23, as shown in FIG. 9A; tabs 101 of plates 110 (FIG. 7) engage recesses 105 in plate 73; and actuator 80 (FIG. 6) is operated so as to rotate arms 77 symmetrically via connecting rods 78 and so engage pin 32 inside recesses 84 on jaws 75.

Figure 9B:
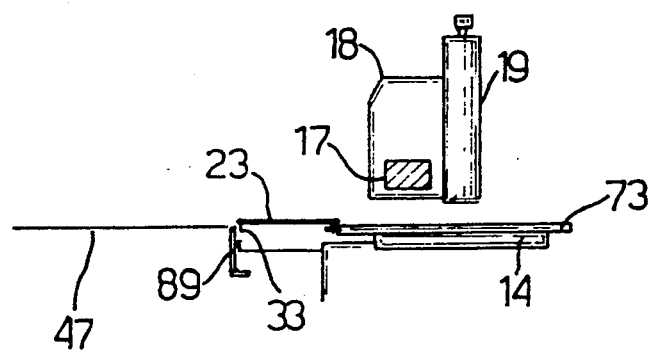

Table 14 is then moved forward, taking pin 32 with it inside jaws 75 and so withdrawing pack 23 from cell 46. As rear edge 31 of pack 23 abandons surface 47, the rear of pack 23 rests on the two tabs 101 of plates 100 (FIG. 7); and table 14 is arrested upon rear edge 31 being detected by photoelectric sensor 103. Pin 33 at this point is located slightly forward in relation to bar 89, as shown in FIG. 9B, and the control unit memorizes the length of pack 23 determined by sensor 103.

At this point, actuator 96 (FIG. 7) is operated so as to position the top portion of bar 89 behind pin 33 of pack 23; actuator 80 (FIG. 6) opens jaws 75 to release pin 32; and table 14 is backed up again so as to first arrest pack 23 with rear pin 33 contacting groove 90 of bar 89.

Figure 9C:
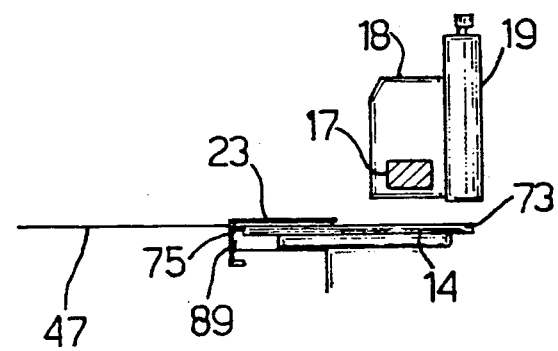

As it continues moving, table 14 causes pack 23 to slide on to plate 73, and pin 32 to engage and slide inside the gap between bars 108 and 110 (FIG. 5), which movement is arrested according to the length of pack 23 detected by sensor 103, so that table 14 is finally positioned as shown in FIG. 9C wherein jaws 75 correspond with rear pin 33 of pack 23.

Figure 9D:
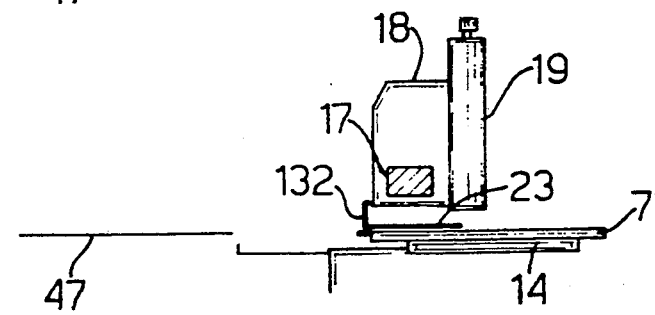

Actuator 113 is then operated so as to rotate lever 116 anticlockwise, together with cranks 119; via connecting rods 118, cranks 119 move bar 110 into the FIG. 5 position wherein it closes against bar 108 so that pin 32 is engaged by bars 108 and 110; table 14 is again moved forward, together with pack 23, until edge 31 of pack 23 moves slightly past blade 132 (FIG. 1); bar 110 is opened by actuator 113; bar 89 is lowered by actuator 96 (FIG. 1); carriage 18 is positioned transversely so that blade 132 corresponds with the mid point of edge 31 of pack 23; and actuator 131 is operated so as to position blade 132 behind edge 31 of pack 23, as shown in FIG. 9D.

Figure 9E:
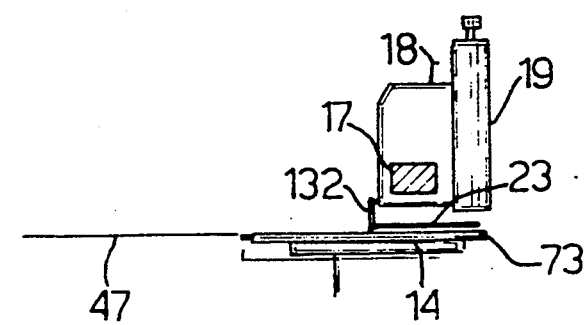

Table 14 is then backed up once more so that pack 23, held by blades 132, slides forward over plate 73 with both pins 32 and 33 between bars 108 and 110 (FIG. 5); front pin 32 engages and is thus centered by the inclined edge 122 of front bar 121; and table 14 is arrested upon front pin 32 of pack 23 approaching fixed stop 123, as shown in FIG. 9E.

Actuator 129 is then operated so as to rotate lever 126 clockwise into the FIG. 5 position; arm 125 engages pin 32 so as to bring it positively into contact with stop 123; and actuator 113 is operated so as to close bar 110 and so also center rear pin 33 and position pack 23 accurately in the work position.

UNLOADING THE PACK

When machined, pack 23 is unloaded off table 14 and returned to the pair of plates 47 from which it was removed.

Figure 10A:
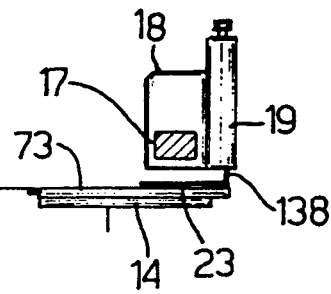
FIGS. 10A, 10B, 10C, 10D, 10E, 10F, and 10G show the operating sequence for unloading the pack off the table.

To unload the pack, table 14 is first backed up, together with pack 23, so as to position front edge 29 of the pack behind front blade 138 of head 19; actuator 129 (FIG. 5) is operated to free pin 32 from arm 125; actuator 113 moves bar 110 away from bar 108 so as to free pin 33; carriage 18 (FIG. 1) is moved transversely so as to position blades 138 and 139 on the center line of pack 23; and actuator 136 is operated so as to lower blade 138, as shown in FIG. 10A.

Figure 10B:
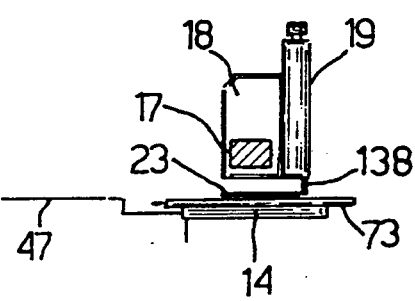
Figure 10C:
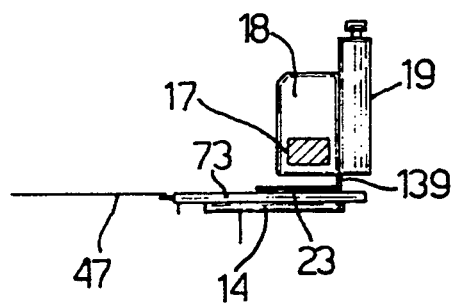

Table 14 is then moved forward by slightly more than the distance between blades 138 and 139, so that pack 23, held by blade 138, slides in relation to table 14 into the position shown in FIG. 10B; blade 138 is raised; table 14 is backed up to position edge 29 behind rear blade 139 of head 19; and actuator 137 is operated to lower blade 139, as shown in FIG. 10C.

Figure 7:
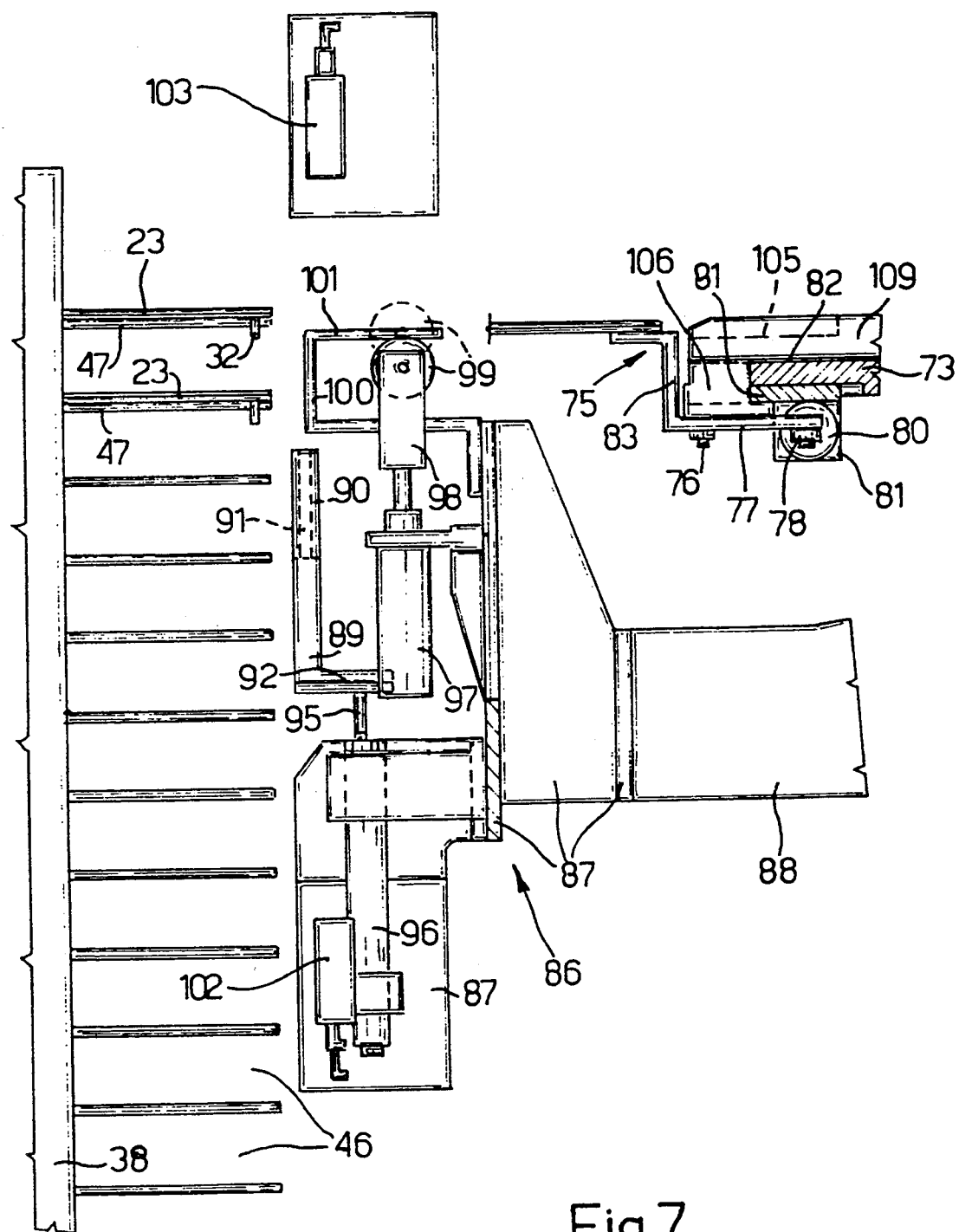
FIG. 7 shows a larger-scale half section of a further detail in FIG. 1.
Figure 10D:
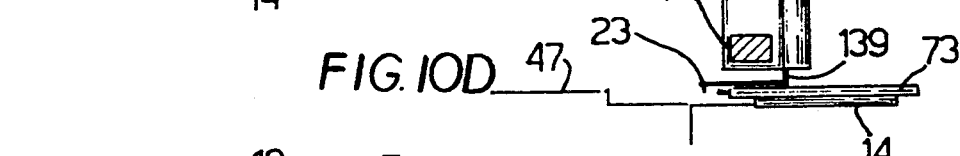

Table 14 is then moved forward, so that pack 23, held by blade 139, slides in relation to table 14; on reaching the end of its forward travel, as shown in FIG. 10D, table 14 is reversed so as to move pack 23 backwards and detach it from blade 139, which is then restored to the raised idle position; at the same time, both actuators 97 (FIG. 8) are operated so as to raise both rollers 99 slightly higher than the surface of plates 47, as shown by the dotted line in FIG. 7.

Figure 10E:
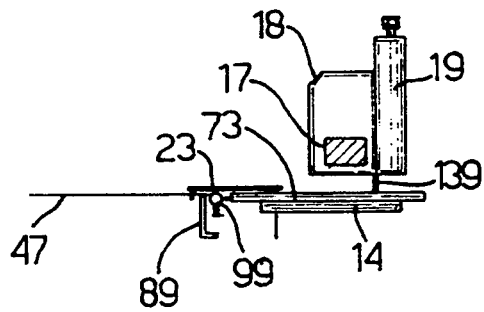

On reaching rollers 99, rear edge 31 of pack 23 is raised by rollers 99 to prevent it from colliding with the edge of plates 47 and so insert it smoothly inside cell 46. This movement continues until rear pin 33 is positioned slightly behind bar 89, as shown in FIG. 10E, at which point actuator 96 is operated to raise bar 89.

Figure 10F:
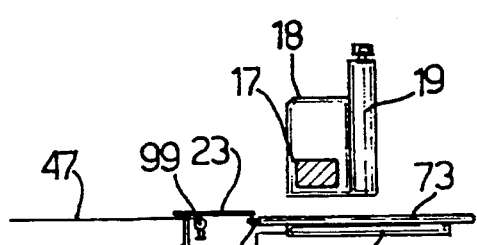

Table 14 is then moved forward together with pack 23, the pin 33 of which engages and is arrested by groove 91 (FIG. 6) on bar 89. As table 14 continues moving, pack 23 slides over plate 73; and table 14 is arrested with jaws 75 corresponding with front pin 32, as shown in FIG. 10F.

Figure 10G:
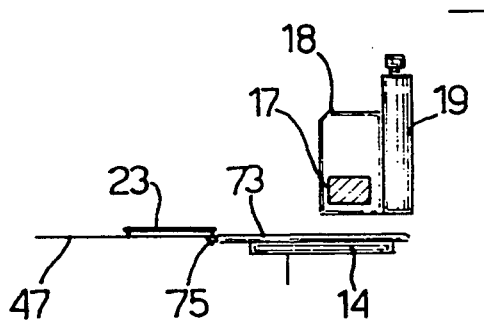

At this point, jaws 75 are closed; bar 89 is lowered; table 14 is backed up into the position shown in FIG. 10G wherein the whole of pack 23 is loaded on to plates 47; rollers 99 (FIG. 7) are lowered into the idle position; jaws 75 are opened; table 14 is moved forward to release jaws 75 from rack 36; and lifter 37 (FIG. 1) is operated to position the next cell 46 on rack 36 on a level with plate 73.

The advantages of the loading and unloading device according to the present invention will be clear from the foregoing description. Firstly, it provides for eliminating the additional device for transferring the packs between the store and work table, and consequently also the respective numerical control axis. Secondly, it provides for accurately positioning the pack on the work table. And, lastly, the location of the lifter behind the drilling machine provides for troublefree access to the machine by the operator, thus enabling in-line installation of a number of similar machines, optimum utilization of the space around the machine, and the formation of a modular drilling center.

To those skilled in the art it will be clear that changes may be made to the device as described and illustrated herein without, however, departing from the scope of the present invention. For example, electric or mechanical actuators may be employed as opposed to the pneumatic types described herein; changes may be made to the design of the pins and relative pin engaging devices; one or more of blades 132, 138 and 139 may be replaced by a plate on the rod of the respective actuator, with a transverse edge designed to engage a given portion of front and rear edges 29, 31 of pack 23; and, finally, the device itself may be employed for loading and unloading any type of workpiece on any machine tool featuring a movable work table.

We claim:

1. A workpiece loading and unloading apparatus for a machine tool having a workpiece carrying table movable along at least one axis (Y) in a pair of opposite directions, said workpiece (23) being provided with a pair of engageable elements (32, 33) distanced from each other along said axis (Y), said apparatus comprising support means (47) for supporting said workpiece (23), transfer means (75, 89, 132, 138, 139) for transferring said workpiece (23) between said support means (47) and a work position on said table (14), said transfer means (75, 89, 132, 138, 139) including an engaging device (75) carried by said table (14) and operable for engaging a first one of said elements (32, 33) for causing a first predetermined stroke of said workpiece (23) between said support means (47) and said work position upon moving said table (14) in one of said directions, said transfer means (75, 89, 132, 138, 139) also including at least one retaining member (89) fitted with a stationary part (87) of said machine tool and positionable in an active position for engaging a second one of said elements (32, 33) to cause another stroke of said workpiece (23) between said support means (47) and said work position upon a movement of said table (14) in other one of said directions.

2. A method of loading and unloading a part (23) between a support (47) and a machine tool workpiece table (14) movable along at least one axis in a forward direction and in a return direction, including the following steps for loading said part (23):

engaging a first pin (32) of said part (23) with said table (14);

extracting from said support (47) the so engaged part (23) by moving said table (14) in said forward direction;

retaining a second pin (33) of said part (23) while said table (14) is moved in said return direction;

re-engaging said first pin (32) with said table (14); and additionally moving said table (14) in said forward direction.

3. A workpiece loading and unloading apparatus for a machine tool having a workpiece carrying table movable along at least one axis (Y) in a pair of opposite directions, said workpiece being formed of a pack (23) of printed circuit boards (24), said pack (23) being provided with a pair of engageable pins (32, 33) distanced from each other along said axis (Y), said apparatus comprising support means (47) for supporting said pack (23), transfer means (75, 89, 132, 138, 139) for transferring said pack (23) between said support means (47) and a work position on said table (14), said transfer means (75, 89, 132, 138, 139) including an engaging device (75) carried by said table (14) and operable for engaging a first one of said pins (32, 33) for causing a first predetermined stroke of said pack (23) between said support means (47) and said work position upon moving said table (14) in one of said directions, said transfer means (75, 89, 132, 138, 139) also including at least one retaining member (89) fitted with a stationary part (87) of said machine tool and positionable in an active position for engaging the other one of said pins (32, 33) to cause another stroke of said pack (23) between said support means (47) and said work position upon a movement of said table (14) in the other one of said directions.

4. An apparatus according to claim 3, wherein said boards (24) are arranged in said pack (23) between an auxiliary bottom plate (26) and an auxiliary cover plate (27), said pins (32, 33) being located at the mid point of a pair of opposite edges (29, 31) of said pack (23) and projecting downwards from said bottom plate (26) perpendicularly thereto, said engaging device comprising a pair of jaws (75) substantially coplanar with said table (14) and designed to grip said first pin (32).

5. An apparatus as claimed in claim 4, wherein said retaining member comprises a vertical bar (89) having a groove (90,91) for arresting the reverse longitudinal travel of said other pin (33); said first pin (32) being located on the front edge (29) of said pack (23); and said other pin (33) being located on the rear edge (31) of said pack (23).

6. An apparatus as claimed in claim 4, wherein said fixed part (87) presents at least one member (101) for temporarily supporting said pack (23) as this is withdrawn off said supporting means (47).

7. An apparatus as claimed in claim 4, wherein said table (14) comprises a fixed locating bar (108) and a movable locating bar (110) parallel to said fixed bar (108); actuating means (113, 116, 119) being provided for moving said movable bar (110) parallel to itself, for locating said pins (32, 33) on said table (14).

8. An apparatus as claimed in claim 7, wherein said actuating means (113, 116, 119) comprise a pair of mechanisms (118, 119, 140) having a corresponding pair of symmetrical cranks (119) rotated simultaneously in opposite directions by a common actuator (113).

9. An apparatus as claimed in claim 5, wherein said table (14) comprises a fixed bar (108) and a movable bar (110) parallel to said fixed bar (108); and actuating means (113, 116, 119) for moving said movable bar (110) parallel to itself for temporarily gripping said first pin (32) in an adjustable position along said axis (Y) while said table (14) is moved in said first direction, whereby said pack (23) is moved through a third stroke toward said work position.

10. An apparatus as claimed in claim 9, wherein said machine tool is a drilling machine, and wherein said transfer means (14, 75, 89, 132, 138, 139) comprise a second retaining member (132) on a portion (18) of said drilling machine, for engaging said rear edge (31) and so sliding said pack (23) in relation to said table.

11. An apparatus as claimed in claim 10, wherein said table comprises a locating stop (123) for said first pin (32); and an aligning member (125) for engaging said first pin (32) and moving it positively into contact with said locating stop (123).

12. An apparatus device as claimed in claim 5, wherein said drilling machine comprises a pair of further retaining members (138, 139) located a given longitudinal distance apart and operated individually for engaging said front edge (29) in the course of two successive movements of said table (14) and so returning said pack (23) towards said supporting means (47).

13. An apparatus as claimed in claim 5, wherein said bar (89) presents a first vertical groove (90) and a second vertical groove (91) opposite said first groove (90), said first groove (90) being provided for locking said other pin (33) in the course of a movement of said table (14) in said return direction, said second groove (91) being provided for locking said other pin (33) of said pack (23) in the course of a further movement of said table (14).

14. An apparatus as claimed in claim 13, wherein said fixed part (87) presents at least one rolling member (99) positionable on the return path of said rear edge (31), for enabling said table (14) to replace said pack (23) on said supporting means (47).

15. A machine tool part loading and unloading apparatus, wherein a work table (14) travels along at least one axis (Y), and which comprises support plates (47) for supporting corresponding parts (23) to be transferred between said corresponding support plate (47) and a work position on said table (14), transfer means (75, 89, 132, 138, 139) for so transferring one of said parts (23), said transfer means (75, 89, 132, 138, 139) comprising a device (75) on said table (14) for engaging said one part (23) and for transferring the same part (23) by moving said table (14) along said axis (Y), said apparatus also comprising a store (36) with a number of cells (46), each one housing at least one of said support plates (47) for one of said parts (23), and an operating device (37) for moving said store (36) and selecting one of said cells (46) at a time for causing said transfer means (75, 89, 132, 138, 139) to transfer said corresponding part (23).

16. An apparatus as claimed in claim 15, wherein said machine tool comprises a machining head (19) movable transversely in relation to said table (14); said axis (Y) being a longitudinal axis; characterized by the fact that said operating device (37) is connected to the bed of said machine tool, at the rear of the machine.

17. An apparatus as claimed in claim 16, wherein said store (36) is connectable in removable manner to said operating device (37); characterized by the fact that said store (36) is fitted on to said operating device (37) at the rear of said machine tool; mutual longitudinal guide means (63, 66) being provided between said operating device (37) and said store (36).

18. An apparatus as claimed in claim 17, wherein said cells (46) consist of a number of pairs of vertically-aligned plates (47) on a rack (36); and wherein said operating device consists of a lifter (37) operatable in steps; characterized by the fact that, on each of two opposite sides, said lifter (37) comprises a pair of pantographs (56); an actuating member (61) common to said pantographs (56) being controlled by the sensor (70) of a toothed member (69) for controlling said step operation.

19. A method as claimed in claim 2 also comprising further step wherein said table (14) is moved in said return direction while said part (23) is again retained, for positioning one of said pins (32, 33) is aligned positively in relation to a locating stop (123); and a step wherein another of said pins (32, 33) is located.

20. A method as claimed in claim 2, wherein for unloading said part (23) off said table (14), it comprises:
 a step wherein said table (14) is moved while said part (23) is retained by at least one retaining element (138);
 a step wherein said part (23) is arrested in an intermediate position; and
 a step wherein said table (14) is moved in said forward direction with said part (23) so arrested, for engaging said first pin (32).

21. A method as claimed in claim 20, also comprising a step wherein said part (23) is raised to position it on a level with said support (47); and a step wherein said table (14) is moved for loading said part (23) on to said support (47).

* * * * *